United States Patent
Chintarlapalli Reddy et al.

(10) Patent No.: US 10,163,884 B1
(45) Date of Patent: Dec. 25, 2018

(54) CELL ARCHITECTURE WITH INTRINSIC DECOUPLING CAPACITOR

(71) Applicant: QUALCOMM Incorporated, San Diego, CA (US)

(72) Inventors: Harikrishna Chintarlapalli Reddy, Bengaluru (IN); Jonathan Holland, Cary, NC (US); Sajin Mohamad, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 15/667,576

(22) Filed: Aug. 2, 2017

(51) Int. Cl.
*H01L 27/02* (2006.01)
*G06F 17/50* (2006.01)
(Continued)

(52) U.S. Cl.
CPC ...... *H01L 27/0207* (2013.01); *H01L 23/5223* (2013.01); *H01L 27/11807* (2013.01);
(Continued)

(58) Field of Classification Search
None
See application file for complete search history.

(56) References Cited

U.S. PATENT DOCUMENTS 5,656,834 A   8/1997  Grzyb et al.
7,262,951 B2  8/2007  Hou et al.
(Continued)

FOREIGN PATENT DOCUMENTS

JP   H05174578 A   7/1993

OTHER PUBLICATIONS

Kurokawa A., et al., "DEPOGIT: Dense Power-Ground Interconnect Architecture for Physical Design Integrity", IEEE, Design Automation Conference, Semiconductor Technology Academic Research Center, Feb. 2004, pp. 1-7.
(Continued)

*Primary Examiner* — Stacy Whitmore
(74) *Attorney, Agent, or Firm* — Arent Fox, LLP and Qualcomm

(57) ABSTRACT

An IC includes an array of cells and a first set of endcap cells. The array of cells includes a first set of $M_x$ layer power interconnects coupled to a first voltage, a first set of $M_x$ layer interconnects, a second set of $M_x$ layer power interconnects coupled to a second voltage source, and a second set of $M_x$ layer interconnects. The first set of endcap cells includes first and second sets of $M_{x+1}$ layer interconnects. The first set of $M_{x+1}$ layer interconnects is coupled to the first set of $M_x$ layer power interconnects and to the second set of $M_x$ layer interconnects to provide a first set of decoupling capacitors. The second set of $M_{x+1}$ layer interconnects is coupled to the second set of $M_x$ layer power interconnects and to the first set of $M_x$ layer interconnects to provide a second set of decoupling capacitors.

30 Claims, 8 Drawing Sheets

(51) Int. Cl.
    *H03K 19/00*      (2006.01)
    *H01L 27/118*     (2006.01)
    *H03K 19/177*     (2006.01)
    *H01L 23/522*     (2006.01)
(52) U.S. Cl.
    CPC ............... *H03K 19/17736* (2013.01); *H01L 2027/11827* (2013.01); *H01L 2027/11875* (2013.01); *H01L 2027/11881* (2013.01)

(56) References Cited

U.S. PATENT DOCUMENTS

| | | | |
|---|---|---|---|
| 7,739,624 B2 | 6/2010 | McElvain et al. | |
| 7,761,831 B2 | 7/2010 | Mai et al. | |
| 9,502,400 B2 | 11/2016 | Chen et al. | |
| 2007/0045770 A1* | 3/2007 | Aoki | H01L 27/0207 |
| | | | 257/516 |
| 2014/0078805 A1* | 3/2014 | Kajigaya | G11C 5/025 |
| | | | 365/72 |

OTHER PUBLICATIONS

Partial International Search Report—PCT/US2018/041315—ISA/EPO—dated Sep. 28, 2018.

* cited by examiner

CELL ARCHITECTURE WITH INTRINSIC DECOUPLING CAPACITOR

BACKGROUND

Field

The present disclosure relates generally to a cell architecture, and more particularly, to a cell architecture with one or more intrinsic decoupling capacitors.

Background

A standard cell device is an integrated circuit (IC) that implements digital logic. An application-specific IC (ASIC), such as a system-on-a-chip (SoC) device, may contain thousands to millions of standard cell devices. A typical IC includes a stack of sequentially formed layers. Each layer may be stacked or overlaid on a prior layer and patterned to form the shapes that define transistors (e.g., field effect transistors (FETs) and/or a fin FETs (FinFETs)) and connect the transistors into circuits.

Decoupling capacitors (also referred to as bypass capacitors) decouple one part of a circuit from another part of a circuit. Noise caused by circuit elements may be shunted through decoupling capacitors, reducing the effect that the noise has on other circuit elements. There is currently a need for improvements in the design of decoupling capacitors.

SUMMARY

In an aspect of the disclosure, an IC includes at least a first IC portion and a second IC portion on a first side of the first IC portion. The IC includes an array of cells in the first IC portion. The array of cells includes a first set of metal x ($M_x$) layer power interconnects coupled to a first voltage source and extending adjacent to a p-type metal oxide semiconductor (MOS) (pMOS) active region in a first direction across the array of cells, a first set of $M_x$ layer interconnects extending adjacent to the pMOS active region in the first direction across the array of cells, a second set of $M_x$ layer power interconnects coupled to a second voltage source less than the first voltage source and extending adjacent to an n-type MOS (nMOS) active region in the first direction across the array of cells, and a second set of $M_x$ layer interconnects extending adjacent to the nMOS active region in the first direction across the array of cells. The IC further includes a first set of endcap cells in the second IC portion. The first set of $M_x$ layer power interconnects, the first set of $M_x$ layer interconnects, the second set of $M_x$ layer power interconnects, and the second set of $M_x$ layer interconnects further extend across the first set of endcap cells. The first set of endcap cells includes a first set of metal x+1 ($M_{x+1}$) layer interconnects extending in a second direction orthogonal to the first direction. The first set of $M_{x+1}$ layer interconnects is coupled to the first set of $M_x$ layer power interconnects and to the second set of $M_x$ layer interconnects to provide the first voltage source at the second set of $M_x$ layer interconnects. The first set of endcap cells further includes a second set of $M_{x+1}$ layer interconnects extending in the second direction. The second set of $M_{x+1}$ layer interconnects is coupled to the second set of $M_x$ layer power interconnects and to the first set of $M_x$ layer interconnects to provide the second voltage source at the first set of $M_x$ layer interconnects. The first set of $M_x$ layer power interconnects and the first set of $M_x$ layer interconnects function as a first set of decoupling capacitors, and the second set of $M_x$ layer power interconnects and the second set of $M_x$ layer interconnects function as a second set of decoupling capacitors.

In an aspect of the disclosure, an IC and a method of operation of an IC are provided. The IC includes at least a first IC portion and a second IC portion on a first side of the first IC portion. A first voltage is provided in a first set of $M_x$ layer power interconnects. An array of cells is in the first IC portion. The array of cells includes the first set of $M_x$ layer power interconnects coupled to a first voltage source and extending adjacent to a pMOS active region in a first direction across the array of cells. The array of cells further includes a first set of $M_x$ layer interconnects extending adjacent to the pMOS active region in the first direction across the array of cells. A second voltage is provided in a second set of $M_x$ layer power interconnects. The array of cells includes the second set of $M_x$ layer power interconnects coupled to a second voltage source less than the first voltage source and extending adjacent to an nMOS active region in the first direction across the array of cells. The array of cells further includes a second set of $M_x$ layer interconnects extending adjacent to the nMOS active region in the first direction across the array of cells. A first set of endcap cells is in the second IC portion. The first set of $M_x$ layer power interconnects, the first set of $M_x$ layer interconnects, the second set of $M_x$ layer power interconnects, and the second set of $M_x$ layer interconnects further extend across the first set of endcap cells. The first voltage is provided at the second set of $M_x$ layer interconnects. The first set of endcap cells includes a first set of $M_{x+1}$ layer interconnects extending in a second direction orthogonal to the first direction. The first set of $M_{x+1}$ layer interconnects is coupled to the first set of $M_x$ layer power interconnects and to the second set of $M_x$ layer interconnects to provide the first voltage source at the second set of $M_x$ layer interconnects. The second voltage is provided at the first set of $M_x$ layer interconnects. The first set of endcap cells includes a second set of $M_{x+1}$ layer interconnects extending in the second direction. The second set of $M_{x+1}$ layer interconnects is coupled to the second set of $M_x$ layer power interconnects and to the first set of $M_x$ layer interconnects to provide the second voltage source at the first set of $M_x$ layer interconnects. The first set of $M_x$ layer power interconnects and the first set of $M_x$ layer interconnects function as a first set of decoupling capacitors, and the second set of $M_x$ layer power interconnects and the second set of $M_x$ layer interconnects function as a second set of decoupling capacitors.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
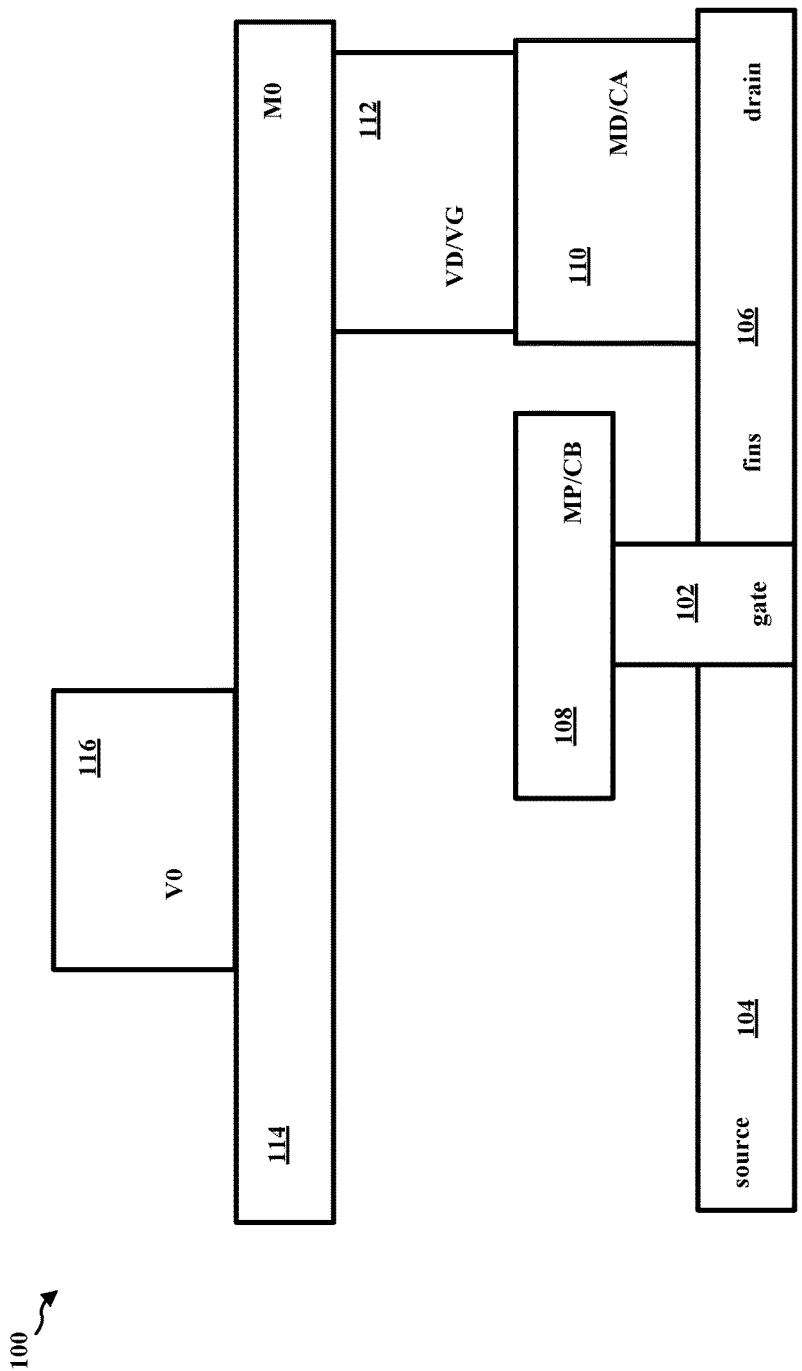
FIG. 1 is a first diagram illustrating a side view of various layers within a standard cell and IC.
Figure 2:
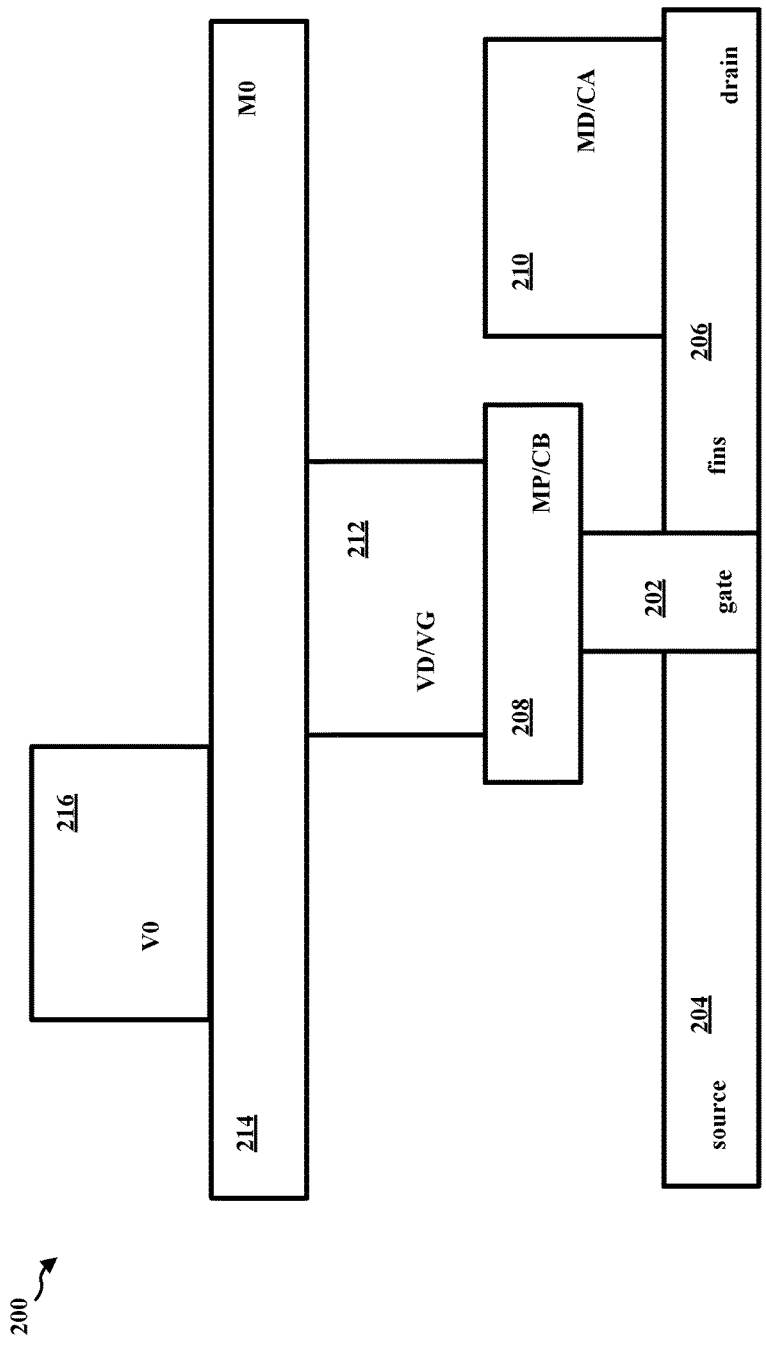
FIG. 2 is a second diagram illustrating a side view of various layers within a standard cell and IC.

Decoupling capacitors decouple one part of a circuit from another part of a circuit. Noise caused by circuit elements may be shunted through decoupling capacitors, reducing the effect that the noise has on other circuit elements. Decoupling capacitors may take up a lot of space on an IC. An exemplary (standard) cell architecture with intrinsic/built-in decoupling capacitors is provided infra. The exemplary cell architecture with intrinsic/built-in decoupling capacitors may save space on an IC, as the decoupling capacitors are intrinsic and built into standard cells that perform various logic functions, such as buffers, inverters, AND gates, NAND gates, OR gates, NOR gates, and other logic functions. In one configuration, the exemplary decoupling capacitors may be formed intrinsically within standard cells on a metal 0 (M0) layer. FIG. 1 and FIG. 2 provide side views of various layers including the M0 layer within a standard cell and IC.

FIG. 1 is a first diagram 100 illustrating a side view of various layers within a standard cell and IC. As illustrated in FIG. 1, a transistor has a gate 102, a source 104, and a drain 106. The source 104 and the drain 106 may be formed by fins. A contact B (CB) layer interconnect 108 (also referred to as a metal POLY (MP) layer interconnect) may contact the gate 102. A contact A (CA) layer interconnect 110 (also referred to as a metal diffusion (MD) layer interconnect) may contact the source 104 or the drain 106. A via 112 (which may be referred to as via D (VD) or via G (VG)) may contact the CA layer interconnect 110. The vias VD, VG 112 are formed by separate masks in at least a double patterning process. An M0 layer interconnect 114 contacts the via VD/VG 112. A via V0 116 may contact the M0 layer interconnect 114.

FIG. 2 is a second diagram 200 illustrating a side view of various layers within a standard cell and IC. As illustrated in FIG. 2, a transistor has a gate 202, a source 204, and a drain 206. The source 204 and the drain 206 may be formed by fins. A CB layer interconnect 208 may contact the gate 202. A CA layer interconnect 210 may contact the source 204 or the drain 206. A via 212 VD/VG may contact the CB layer interconnect 208. An M0 layer interconnect 214 contacts the via VD/VG 212. A via V0 216 may contact the M0 layer interconnect 214.

As discussed supra, an exemplary cell architecture with intrinsic decoupling capacitors is provided infra. The decoupling capacitors are built into standard cells that provide various logic functions. For example, standard cells that provide logic functionality such as buffers, inverters, AND gates, NAND gates, OR gates, NOR gates, and other logic functions may further include built-in decoupling capacitors. Such built-in decoupling capacitors may be coupled to $V_{dd}$ and $V_{ss}$ through interconnects within endcap cells, through interconnects in complementary MOS (CMOS) break cells that are predominantly void of pMOS/nMOS active regions (also referred to as oxide diffusion (OD) regions), and/or otherwise through interconnects that extend at/over breaks of the pMOS/nMOS active regions (OD breaks). Examples of exemplary cell architectures with intrinsic/built-in decoupling capacitors are provided infra with respect to FIGS. 3-7.

Figure 3:
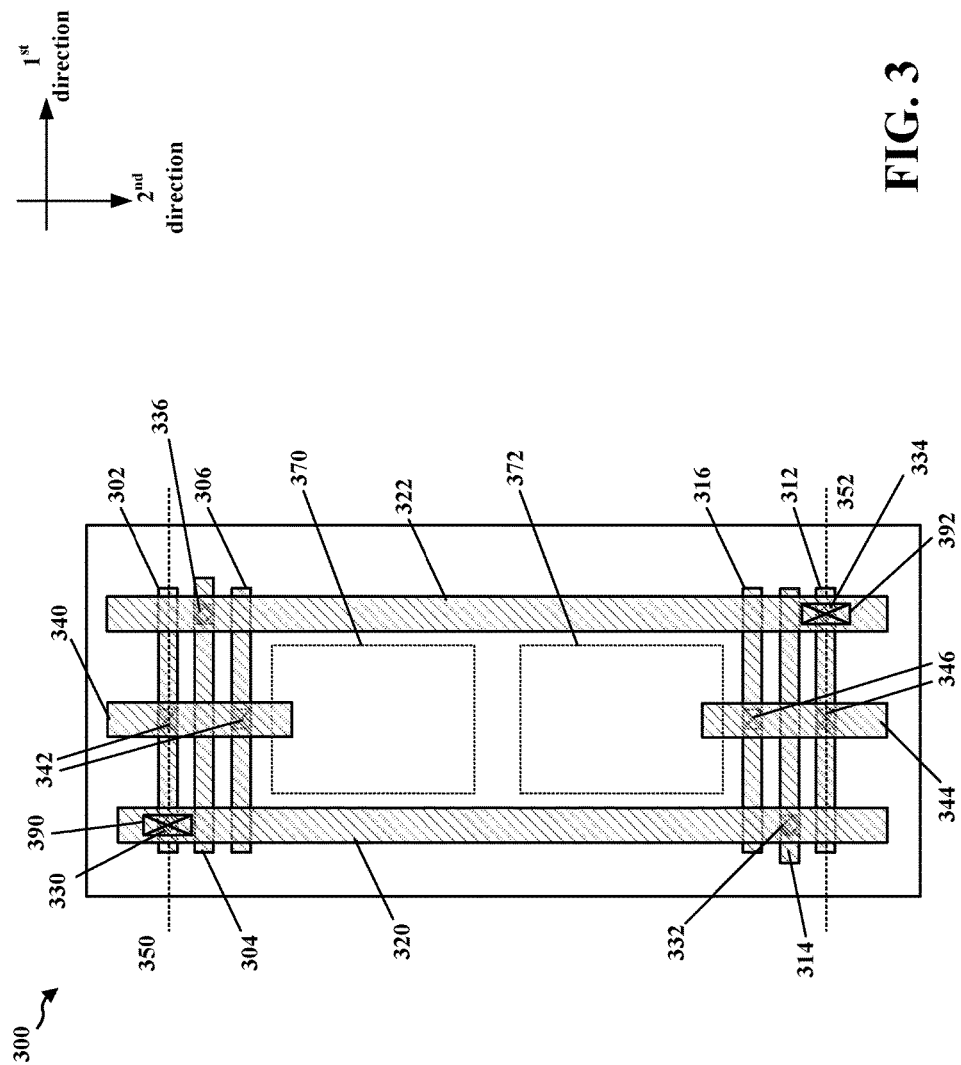
FIG. 3 is a diagram conceptually illustrating a plan view of a cell architecture with intrinsic decoupling capacitors.

FIG. 3 is a diagram conceptually illustrating a plan view of a cell architecture with intrinsic decoupling capacitors. Note that FIG. 3 is a simplified illustration to facilitate the explanation of the exemplary cell architecture with intrinsic decoupling capacitors. Referring to FIG. 3, an IC 300 includes a first set of $M_x$ layer power interconnects 302, 306. The $M_x$ layer power interconnect 302 is coupled to $V_{dd}$. The $M_x$ layer power interconnect 306 is also coupled to $V_{dd}$, as the $M_x$ layer power interconnect 306 is coupled to the $M_x$ layer power interconnect 302 through the $M_{x+1}$ layer interconnect 340, which is connected to the first set of $M_x$ layer power interconnects 302, 306 by vias $V_x$ 342. The IC 300 further includes a second set of $M_x$ layer power interconnects 312, 316. The $M_x$ layer power interconnect 312 is coupled to $V_{ss}$. The $M_x$ layer power interconnect 316 is also coupled to $V_{ss}$, as the $M_x$ layer power interconnect 316 is coupled to the $M_x$ layer power interconnect 312 through the $M_{x+1}$ layer interconnect 344, which is connected to the second set of $M_x$ layer power interconnects 312, 316 by vias $V_x$ 346. The first and second sets of $M_x$ layer power interconnects 302, 306, 312, 316 extend in a first direction. The $M_x$ layer power interconnect 302 is located at a top edge 350 of a standard cell in a pMOS region. The $M_x$ layer power interconnect 302 may be shared with an adjoining standard cell above the top edge 350. The $M_x$ layer power interconnect 312 is located at a bottom edge 352 of a standard cell in an nMOS region. The $M_x$ layer power interconnect 312 may be shared with an adjoining standard cell below the bottom edge 352.

The IC 300 further includes a first set of $M_x$ layer interconnects 304 (in FIG. 3, just one interconnect is illustrated in the first set of $M_x$ layer interconnects) and a second set of $M_x$ layer interconnects 314 (in FIG. 3, just one interconnect is illustrated in the second set of $M_x$ layer interconnects). The first set of $M_x$ layer power interconnects 302, 306 and the first set of $M_x$ layer interconnects 304 form a first set of decoupling capacitors adjacent a pMOS active region 370 (where pMOS transistors are located). The second set of $M_x$ layer power interconnects 312, 316 and the second set of $M_x$ layer interconnects 314 form a second set of decoupling capacitors adjacent an nMOS active region 372 (where nMOS transistors are located). In FIG. 3, four decoupling capacitors are illustrated, as the terminals of the decoupling capacitors are 302/304, 306/304, 314/312, and 314/316. Assuming there are $S_{1p}$ $M_x$ layer power interconnects in the first set of $M_x$ layer power interconnects, $S_1$ $M_x$ layer interconnects in the first set of $M_x$ layer interconnects, $S_{2p}$ $M_x$ layer power interconnects in the second set of $M_x$ layer power interconnects, and $S_2$ $M_x$ layer interconnects in the second set of $M_x$ layer interconnects, where $|S_{1p}-S_1|\leq 1$ and $|S_{2p}-S_2|\leq 1$, then the first set of decoupling capacitors would include $S_{1p}+S_1-1$ decoupling capacitors, and the second set of decoupling capacitors would include $S_{2p}+S_2-1$ decoupling capacitors.

The IC 300 further includes a first set of $M_{x+1}$ layer interconnects 320 (in FIG. 3, just one interconnect is illustrated in the first set of $M_{x+1}$ layer interconnects) that extends in a second direction orthogonal to the first direction. The first set of $M_{x+1}$ layer interconnects 320 couples the $M_x$ layer power interconnect 302 to the $M_x$ layer interconnect 314 through vias $V_x$ 330, 332 in order to provide the voltage $V_{dd}$ at the $M_x$ layer interconnect 314. The IC 300 further includes a second set of $M_{x+1}$ layer interconnects 322 (in FIG. 3, just one interconnect is illustrated in the second set of $M_{x+1}$ layer interconnects) that extends in the second direction. The second set of $M_{x+1}$ layer interconnects 322 couples the $M_x$ layer power interconnect 312 to the $M_x$ layer interconnect 304 through vias $V_x$ 334, 336 in order to provide the voltage $V_{ss}$ at the $M_x$ layer interconnect 304. Accordingly, the first set of $M_{x+1}$ layer interconnects 320 straps the terminal 314 of the decoupling capacitors 314/316, 314/312 to $V_{dd}$. Further, the second set of $M_{x+1}$ layer interconnects 322 straps the terminal 304 of the decoupling capacitors 306/304, 302/304 to $V_{ss}$.

The first and second set of $M_{x+1}$ layer interconnects 320, 322 may also be coupled to $V_{dd}$, $V_{ss}$, respectively, through voltage source connections at the vias $V_{x+1}$ 390, 392, respectively. The first and second set of $M_{x+1}$ layer interconnects 320, 322 may be located exterior to an array of standard cells that provide particular logic functionality. In one example, the first and second set of $M_{x+1}$ layer interconnects 320, 322 may be within endcap cells, within CMOS break (standard) cells that are predominantly void of pMOS/nMOS active regions (OD regions), or otherwise within a region that includes a pMOS/nMOS active region break (OD break).

In one configuration, x is less than or equal to three. In another configuration, x is less than or equal to two. In another configuration, x is less than or equal to one. In yet another configuration, x is equal to zero. Accordingly, with x equal to zero, the $M_x$ layer is the M0 layer, the $M_{x+1}$ layer is the M1 layer, the vias $V_x$ are vias V0, and the vias $V_{x+1}$ are vias V1.

Figure 5:
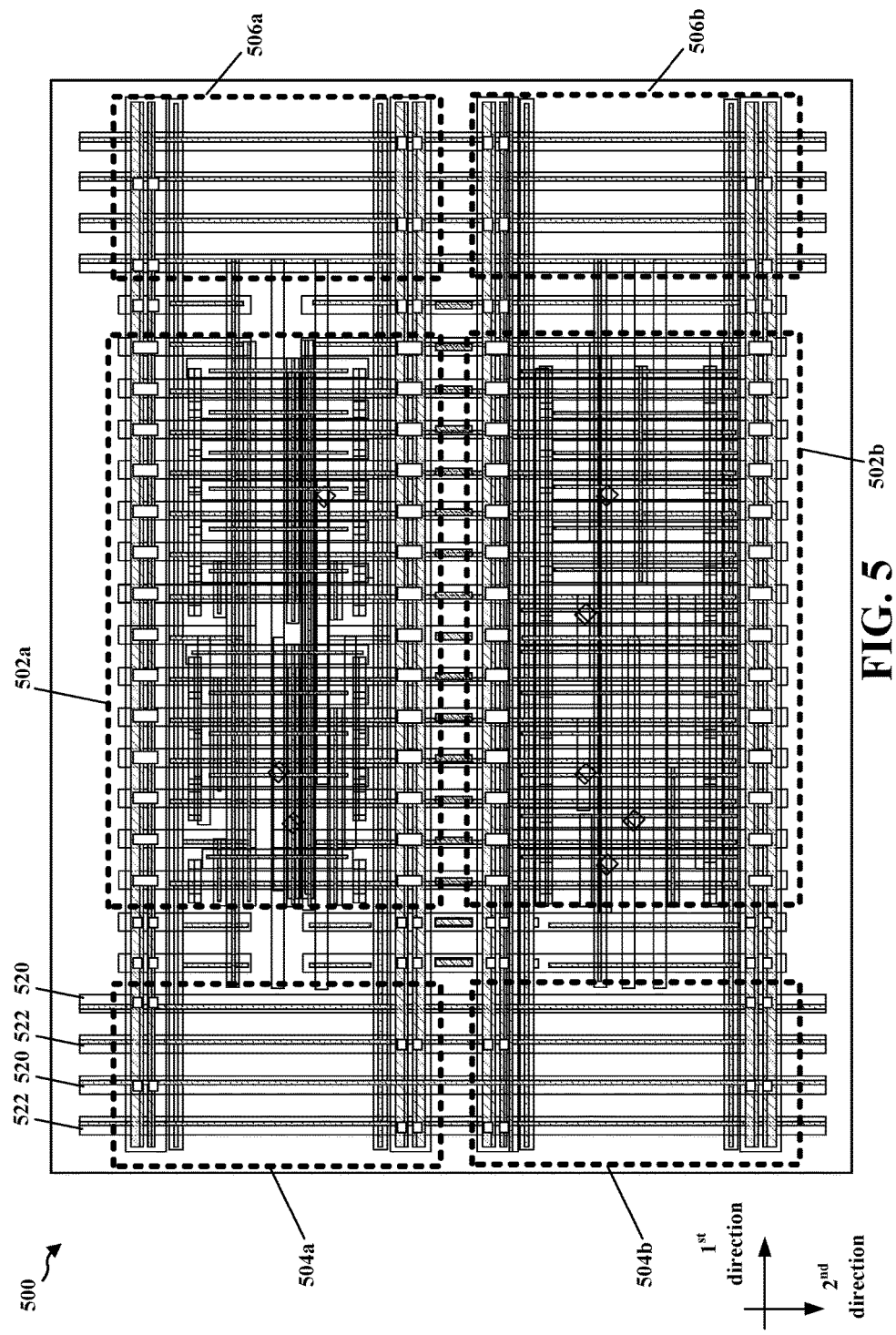
FIG. 5 is a second diagram illustrating a plan view of a macro block including an array of cells and endcap cells.
Figure 6:
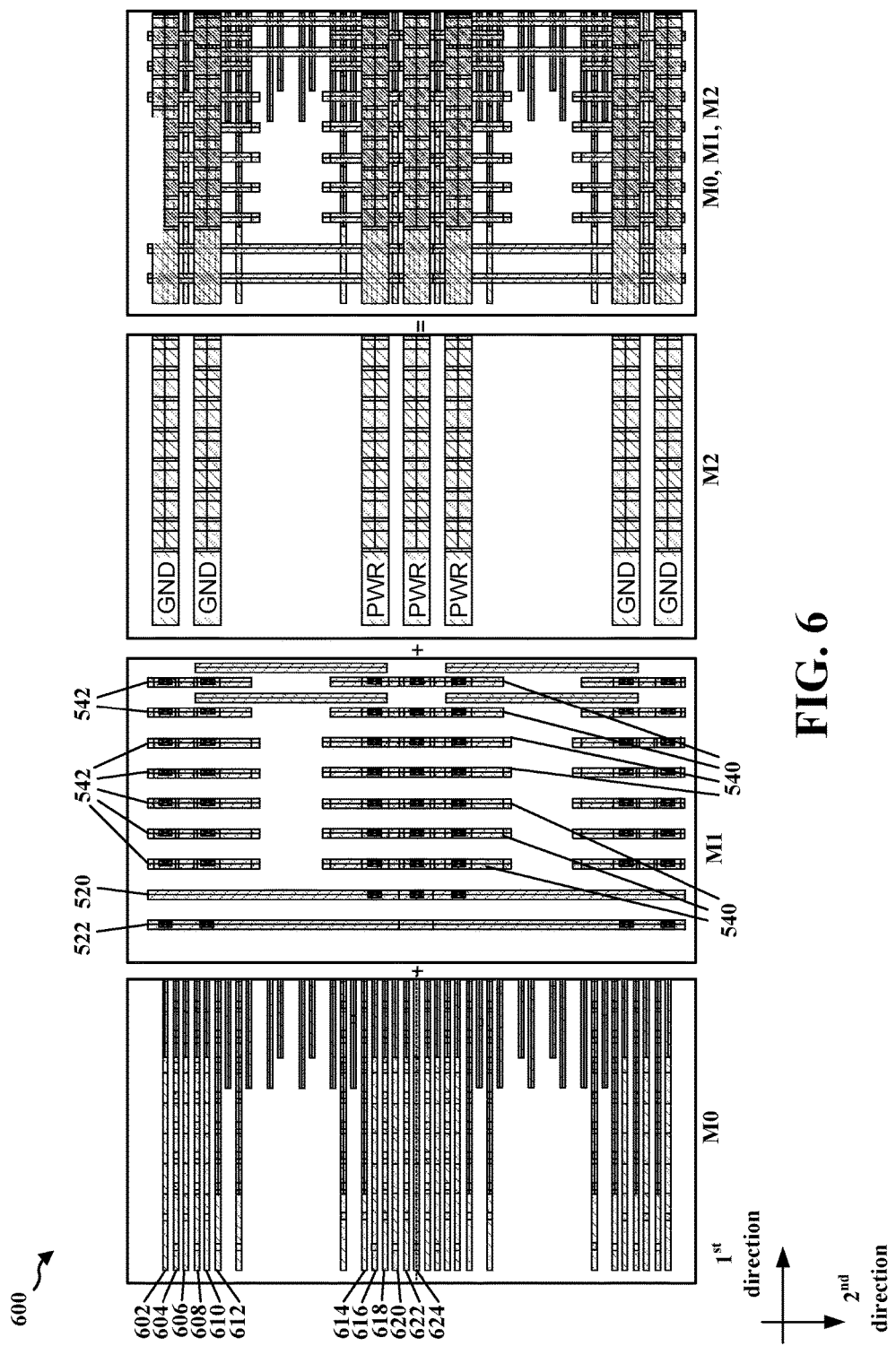
FIG. 6 is a diagram illustrating different metal layers in the macro block of FIG. 5.
Figure 7:
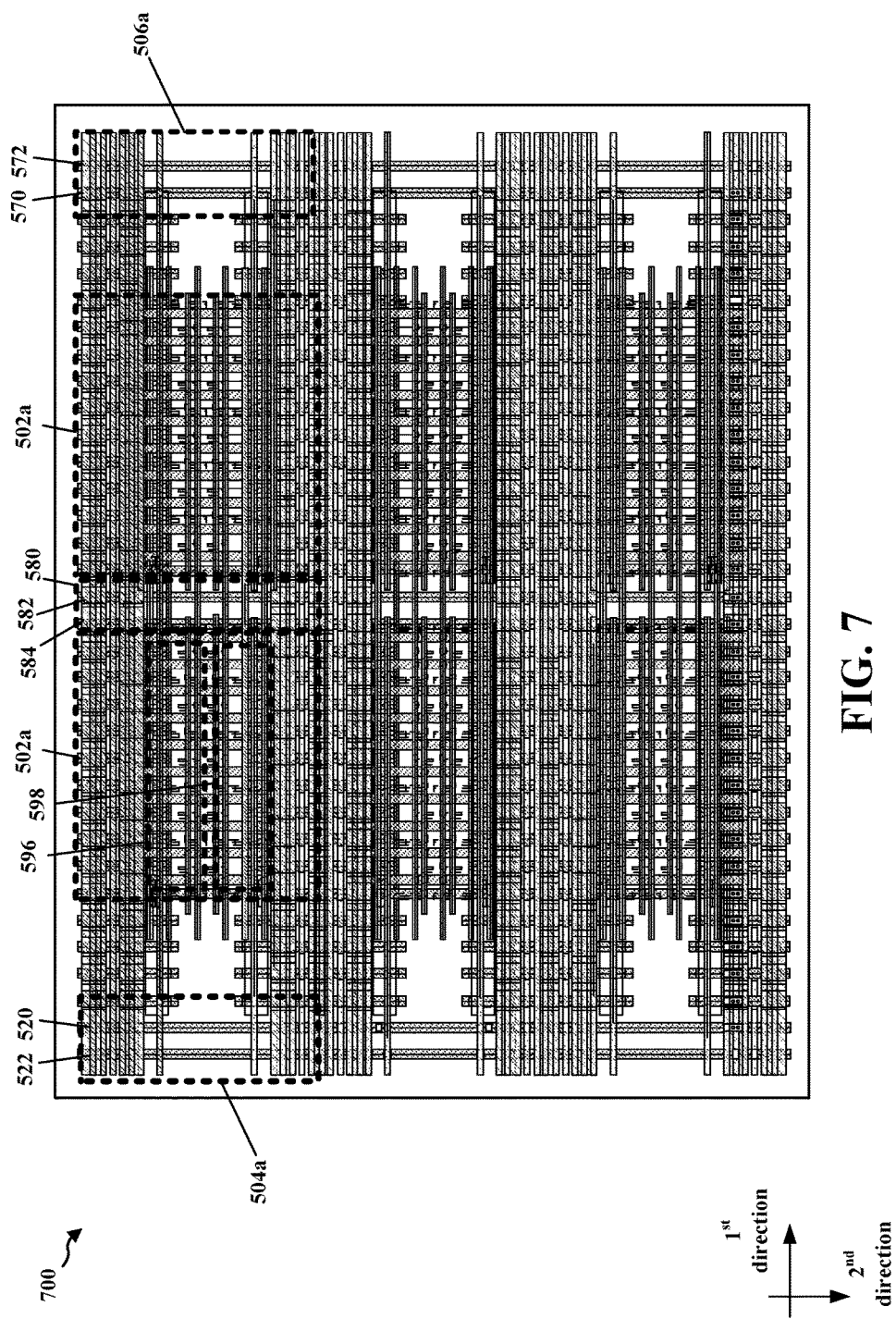
FIG. 7 is a third diagram illustrating a plan view of a macro block including an array of cells and endcap cells.

In the pMOS region of the IC 300, the first set of $M_x$ layer power interconnects 302, 306 and the first set of $M_x$ layer interconnects 304 are interleaving (on every other adjacent track extending in the first direction). In the nMOS region of the IC 300, the second set of $M_x$ layer power interconnects 312, 316 and the second set of $M_x$ layer interconnects 314 are interleaving (on every other adjacent track extending in the first direction). In one configuration, both the first set of $M_x$ layer power interconnects 302, 306 and the second set of $M_x$ layer power interconnects 312, 316 include an interconnect on edges 350 and 352, respectively, of a standard cell. This configuration is illustrated in FIG. 3, as the $M_x$ layer power interconnects 302, 312 are on edges 350, 352, respectively, of a standard cell. However, in another configuration, both the first set of $M_x$ layer interconnects 304 and the second set of $M_x$ layer interconnects 314 include an interconnect on edges 350 and 352, respectively, of a standard cell. Such a configuration is illustrated in FIGS. 5-7. As such, within a pMOS region of the IC 300, the $M_x$ layer interconnect on the edge 350 of the standard cell may be tied to $V_{dd}$ as shown in FIG. 3 or may be tied to $V_{ss}$ as shown in FIGS. 5-7. Further, within an nMOS region of the IC 300, the $M_x$ layer interconnect on the edge 350 of the standard cell may be tied to $V_{ss}$ as shown in FIG. 3 or may be tied to $V_{dd}$ as shown in FIGS. 5-7.

Figure 4:
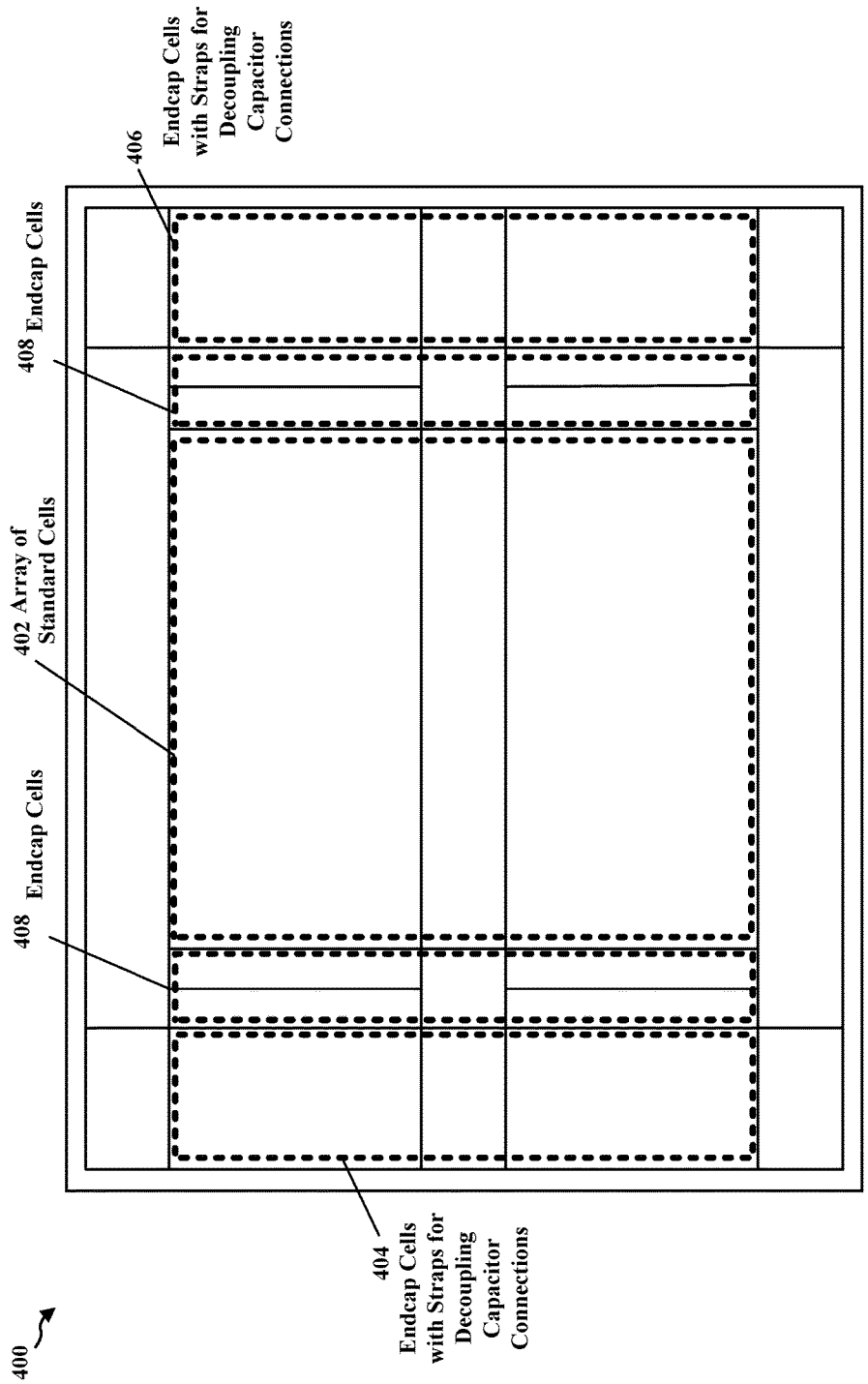
FIG. 4 is a first diagram conceptually illustrating a plan view of a macro block including an array of cells and endcap cells.

FIG. 4 is a first diagram conceptually illustrating a plan view of a macro block including an array of cells 402 and endcap cells 404, 406. Referring to FIG. 4, an IC 400 includes an array of standard cells 402 that perform various logic functions (e.g., buffer, inverter, AND gate, NAND gate, OR gate, NOR gate, and/or other logic functions) and that also include intrinsic/built-in decoupling capacitors. The array of standard cells 402 includes the built-it terminals of the decoupling capacitors, as discussed supra. The built-in terminals are within the standard cells itself (e.g., in M3, M2, M1, or M0) and are not part of interconnects formed during a global routing stage (e.g., in metal layers above $M_y$, where a standard cell includes layers $M_y$ and lower). Adjacent to the array of standard cells 402 are endcap cells 408. Adjacent to the endcap cells are endcap cells 404, 406 that provide straps for tying the terminals of the decoupling capacitors to $V_{dd}$ and $V_{ss}$.

FIG. 5 is a second diagram illustrating a plan view of a macro block including an array of cells and endcap cells. FIG. 6 is a diagram 600 illustrating different metal layers M0, M1, M2 in the macro block of FIG. 5. FIG. 7 is a third diagram illustrating a plan view of a macro block including an array of cells and endcap cells. Referring to FIGS. 5, 6, an IC 500 is illustrated including two rows of arrays of standard cells 502a, 502b. Adjacent the arrays of standard cells 502a, 502b are endcap cells 504a/506a, 504b/506b. Each array of standard cells 502a, 502b includes the first set of $M_x$ layer power interconnects 622, 618, 614, the first set of $M_x$ layer interconnects 624, 620, 616, the second set of $M_x$ layer power interconnects 604, 608, 612, and the second set of $M_x$ layer interconnects 602, 606, 610 that form the terminals of the built-in decoupling capacitors. The endcap cells 504a include the first set of $M_{x+1}$ layer interconnects 520 that provides power (PWR) from the first set of $M_x$ layer power interconnects 622, 618, 614 to the second set of $M_x$ layer interconnects 602, 606, 610, and includes the second set of $M_{x+1}$ layer interconnects 522 that provides ground (GND) from the second set of $M_x$ layer power interconnects 604, 608, 612 to the first set of $M_x$ layer interconnects 624, 620, 616.

The $M_x$ layer interconnects 540 tie the first set of $M_x$ layer power interconnects 622, 618, 614 together and to PWR. The $M_x$ layer interconnects 542 tie the second set of $M_x$ layer power interconnects 604, 608, 612 together and to GND.

As illustrated in FIGS. 5, 6, an IC 500 includes at least a first IC portion 502a and a second IC portion 504a on a first side of the first IC portion 502. The IC 500 includes an array of cells 502a in the first IC portion 502a. Each standard cell in the array of cells 502a provides a logic function, such as for example, a buffer, inverter, AND gate, NAND gate, OR gate, NOR gate, or other logic function. The array of cells 502a includes the first set of $M_x$ layer power interconnects 622, 618, 614 coupled to a first voltage source (e.g., PWR, $V_{dd}$) and extending adjacent to a pMOS active region 598 in a first direction across the array of cells 502a. The array of cells 502a further includes the first set of $M_x$ layer interconnects 624, 620, 616 extending adjacent to the pMOS active region 598 in the first direction across the array of cells 502a. The first set of $M_x$ layer power interconnects 622, 618, 614 and the first set of $M_x$ layer interconnects 624, 620, 616 are interleaving on every other track. As such, if the first set of $M_x$ layer power interconnects 622, 618, 614 extends on odd numbered tracks, the first set of $M_x$ layer interconnects 624, 620, 616 would extend on even numbered tracks. As illustrated in FIG. 6, the first set of $M_x$ layer interconnects 624, 620, 616 has an interconnect (i.e., the $M_x$ layer interconnect 624) on an edge (dotted line) of a standard cell. However, in another configuration, the first set of $M_x$ layer power interconnects 622, 618, 614 may have an interconnect on an edge (dotted line) of a standard cell (e.g., see discussion in relation to FIG. 3). The array of cells 502a further includes a second set of $M_x$ layer power interconnects 604, 608, 612 coupled to a second voltage source (e.g., GND, $V_{ss}$) less than the first voltage source and extending adjacent to an nMOS active region 596 in the first direction across the array of cells 502a. The array of cells 502a further includes a second set of $M_x$ layer interconnects 602, 606, 610 extending adjacent to the nMOS active region 596 in the first direction across the array of cells 502a. The second set of $M_x$ layer power interconnects 604, 608, 612 and the second set of $M_x$ layer interconnects 602, 606, 610 are interleaving on every other track. As such, if the second set of $M_x$ layer power interconnects 604, 608, 612 extends on odd numbered tracks, the second set of $M_x$ layer interconnects 602, 606, 610 would extend on even numbered tracks. As illustrated in FIG. 6, the second set of $M_x$ layer interconnects 602, 606, 610 has an interconnect (i.e., the $M_x$ layer interconnect 602) on an edge (dotted line) of a standard cell. However, in another configuration, the second set of $M_x$ layer power interconnects 604, 608, 612 may have an interconnect on an edge (dotted line) of a standard cell (e.g., see discussion in relation to FIG. 3).

The IC 500 further includes a first set of endcap cells 504a in the second IC portion 504a. The first set of $M_x$ layer power interconnects 622, 618, 614, the first set of $M_x$ layer interconnects 624, 620, 616, the second set of $M_x$ layer power interconnects 604, 608, 612, and the second set of $M_x$ layer interconnects 602, 606, 610 further extend across the first set of endcap cells 504a. The first set of endcap cells 504a includes a first set of $M_{x+1}$ layer interconnects 520 extending in a second direction orthogonal to the first direction. The first set of $M_{x+1}$ layer interconnects 520 is coupled to the first set of $M_x$ layer power interconnects 622, 618, 614 and to the second set of $M_x$ layer interconnects 602, 606, 610 to provide the first voltage source (e.g., PWR, $V_{dd}$) at the second set of $M_x$ layer interconnects 602, 606, 610. The first set of endcap cells 504a further includes a second set of $M_{x+1}$ layer interconnects 522 extending in the second direction. The second set of $M_{x+1}$ layer interconnects 522 is coupled to the second set of $M_x$ layer power interconnects 604, 608, 612 and to the first set of $M_x$ layer interconnects 624, 620, 616 to provide the second voltage source (e.g., GND, $V_{ss}$) at the first set of $M_x$ layer interconnects 624, 620, 616. The first set of $M_x$ layer power interconnects 622, 618, 614 and the first set of $M_x$ layer interconnects 624, 620, 616 function as a first set of decoupling capacitors, and the second set of $M_x$ layer power interconnects 604, 608, 612 and the second set of $M_x$ layer interconnects 602, 606, 610 function as a second set of decoupling capacitors. The first set of decoupling capacitors have terminals 622/624, 622/620, 618/620, 618/616, and 614/616. The second set of decoupling capacitors have terminals 602/604, 606/604, 606/608, 610/608, and 610/612.

As discussed supra, the first set of $M_x$ layer power interconnects 622, 618, 614 and the first set of $M_x$ layer interconnects 624, 620, 616 are interleaving in the second direction (on every other track extending in the first direction), and the second set of $M_x$ layer power interconnects 604, 608, 612 and the second set of $M_x$ layer interconnects 602, 606, 610 are interleaving in the second direction (on every other track extending in the first direction).

As illustrated in FIG. 6, the first set of $M_x$ layer power interconnects 622, 618, 614 includes $S_{1p}$ $M_x$ layer power interconnects, the first set of $M_x$ layer interconnects 624, 620, 616 includes $S_1$ $M_x$ layer interconnects, the second set of $M_x$ layer power interconnects 604, 608, 612 includes $S_{2p}$ $M_x$ layer power interconnects, and the second set of $M_x$ layer interconnects 602, 606, 610 includes $S_2$ $M_x$ layer interconnects, where $|S_{1p}-S_1| \le 1$ and $|S_{2p}-S_2| \le 1$. The first set of $M_x$ layer power interconnects 622, 618, 614 and the first set of $M_x$ layer interconnects 624, 620, 616 form $S_{1p}+S_1-1$ decoupling capacitors, and the second set of $M_x$ layer power interconnects 604, 608, 612 and the second set of $M_x$ layer interconnects 602, 606, 610 form $S_{2p}+S_2-1$ decoupling capacitors. In FIG. 6, $S_{1p}$, $S_1$, $S_{2p}$, and $S_2$ is three, and therefore the first set of $M_x$ layer power interconnects 622, 618, 614 and the first set of $M_x$ layer interconnects 624, 620, 616 form five decoupling capacitors, and the second set of $M_x$ layer power interconnects 604, 608, 612 and the second set of $M_x$ layer interconnects 602, 606, 610 form five decoupling capacitors.

The first set of $M_{x+1}$ layer interconnects 520 and the second set of $M_{x+1}$ layer interconnects 522 are interleaving (on every other track) in the first direction.

The IC 500 further includes a third IC portion 506a on a second side of the first IC portion 502a, where the second side is opposite the first side with respect to the first IC portion 502a. The IC 500 further includes a second set of endcap cells 506a in the third IC portion 506a. The first set of $M_x$ layer power interconnects 622, 618, 614, the first set of $M_x$ layer interconnects 624, 620, 616, the second set of $M_x$ layer power interconnects 604, 608, 612, and the second set of $M_x$ layer interconnects 602, 606, 610 further extend across the second set of endcap cells 506a. The second set of endcap cells 506a includes a third set of $M_{x+1}$ layer interconnects 570 extending in the second direction. The third set of $M_{x+1}$ layer interconnects 570 is coupled to the first set of $M_x$ layer power interconnects 622, 618, 614 and to the second set of $M_x$ layer interconnects 602, 606, 610 to provide the first voltage source (e.g., PWR, $V_{dd}$) at the second set of $M_x$ layer interconnects 602, 606, 610. The second set of endcap cells 506a further includes a fourth set of $M_{x+1}$ layer interconnects 572 extending in the second direction. The fourth set of $M_{x+1}$ layer interconnects 572 is coupled to the second set of $M_x$ layer power interconnects 604, 608, 612 and to the first set of $M_x$ layer interconnects 624, 620, 616 to provide the second voltage source (e.g., GND, $V_{ss}$) at the first set of $M_x$ layer interconnects 624, 620, 616.

Like the first and second sets of $M_{x+1}$ layer interconnects, the third set of $M_{x+1}$ layer interconnects 570 and the fourth set of $M_{x+1}$ layer interconnects 572 are interleaving in the first direction (on every other track extending in the second direction).

The IC may further include a third set of $M_{x+1}$ layer interconnects 540 extending in the second direction and coupling the first set of $M_x$ layer power interconnects 622, 618, 614 together, and a fourth set of $M_{x+1}$ layer interconnects 542 extending in the second direction and coupling the second set of $M_x$ layer power interconnects 604, 608, 612 together.

In one configuration, the first set of $M_x$ layer power interconnects 622, 618, 614 includes a first first-set $M_x$ layer power interconnect 622, the first set of $M_x$ layer interconnects 624, 620, 616 includes a first first-set $M_x$ layer interconnect 624 adjacent the first first-set $M_x$ layer power interconnect 622, the second set of $M_x$ layer power interconnects 604, 608, 612 includes a first second-set $M_x$ layer power interconnect 604, and the second set of $M_x$ layer interconnects 602, 606, 610 includes a first second-set $M_x$ layer interconnect 602 adjacent the first second-set $M_x$ layer power interconnect 604. In such a configuration, the first set of $M_{x+1}$ layer interconnects 520 is coupled to the first first-set $M_x$ layer power interconnect 622 and to the first second-set $M_x$ layer interconnect 602 to provide the first voltage source (e.g., PWR, $V_{dd}$) at the first second-set $M_x$ layer interconnect 602. Further, in such a configuration, the second set of $M_{x+1}$ layer interconnects 522 is coupled to the first second-set $M_x$ layer power interconnect 604 and to the first first-set $M_x$ layer interconnect 624 to provide the second voltage source (e.g., GND, $V_{ss}$) at the first first-set $M_x$ layer interconnect 624. The first first-set $M_x$ layer power interconnect 622 and the first first-set $M_x$ layer interconnect 624 function as a first decoupling capacitor of the first set of decoupling capacitors, and the first second-set $M_x$ layer power interconnect 604 and the first second-set $M_x$ layer interconnect 602 function as a second decoupling capacitor of the second set of decoupling capacitors.

Referring to FIG. 7, the IC 700 may further include a set of CMOS break cells 580 that are predominantly void of a pMOS active region and an nMOS active region. The CMOS break cells 580 may be entirely void of pMOS/nMOS active regions or may be void of pMOS/nMOS active regions except for at the sides that extend in the second direction (i.e., the left/right sides in FIG. 7 that are opposite each other in the first direction). The set of CMOS break cells 580 includes a third set of $M_{x+1}$ layer interconnects 582, 584 extending in the second direction (in FIG. 7, only one $M_{x+1}$ layer interconnect 582 is illustrated). Each $M_{x+1}$ layer interconnect in the third set of $M_{x+1}$ layer interconnects 582, 584 couples one of the first set of $M_x$ layer power interconnects 622, 618, 614 to the second set of $M_x$ layer interconnects 602, 606, 610 to provide the first voltage source (e.g., PWR, $V_{dd}$) at the second set of $M_x$ layer interconnects 602, 606, 610 (as illustrated in FIG. 7, the $M_{x+1}$ layer interconnect 582 provides the coupling), or the second set of $M_x$ layer power interconnects 604, 608, 612 to the first set of $M_x$ layer interconnects 624, 620, 616 to provide the second voltage source (e.g., GND, $V_{ss}$) at the first set of $M_x$ layer interconnects 624, 620, 616 (as illustrated in FIG. 7, the $M_{x+1}$ layer interconnect 584 provides the coupling).

As discussed supra, in one configuration x is ≤3. In another configuration, x is ≤2. In another configuration, x is ≤1. In yet another configuration, x is 0.

Figure 8:
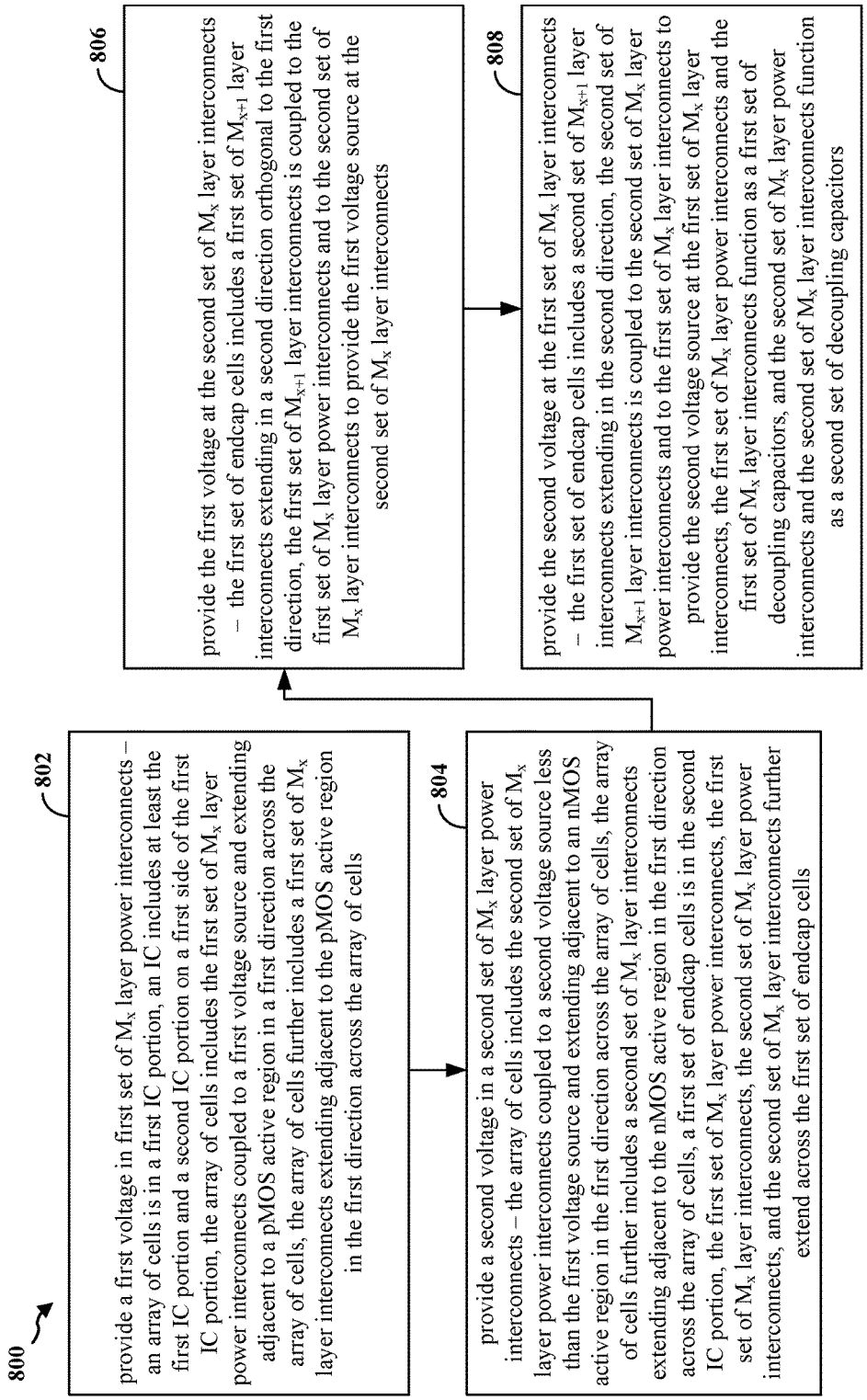
FIG. 8 is a diagram illustrating a method of operation of an exemplary IC.

FIG. 8 is a diagram illustrating a method of operation of an exemplary IC. A method of operation of an IC is provided. The IC includes at least a first IC portion and a second IC portion on a first side of the first IC portion.

At 802, a first voltage (e.g., PWR, $V_{dd}$) is provided in a first set of $M_x$ layer power interconnects 622, 618, 614. The array of cells 502a is in the first IC portion. The array of cells 502a includes the first set of $M_x$ layer power interconnects 622, 618, 614 coupled to a first voltage source (e.g., PWR, $V_{dd}$) and extending adjacent to a pMOS active region 598 in a first direction across the array of cells 502a. The array of cells 502a further includes a first set of $M_x$ layer interconnects 624, 620, 616 extending adjacent to the pMOS active region 598 in the first direction across the array of cells 502a.

At 804, a second voltage (e.g., GND, $V_{ss}$) is provided in a second set of $M_x$ layer power interconnects 604, 608, 612. The array of cells 502a includes the second set of $M_x$ layer power interconnects 604, 608, 612 coupled to a second voltage source (e.g., GND, $V_{ss}$) less than the first voltage source (e.g., PWR, $V_{dd}$) and extending adjacent to an nMOS active region 596 in the first direction across the array of cells 502a. The array of cells 502a further includes a second set of $M_x$ layer interconnects 602, 606, 610 extending adjacent to the nMOS active region 596 in the first direction across the array of cells 502a. A first set of endcap cells is in the second IC portion. The first set of $M_x$ layer power interconnects 622, 618, 614, the first set of $M_x$ layer interconnects 624, 620, 616, the second set of $M_x$ layer power interconnects 604, 608, 612, and the second set of $M_x$ layer interconnects 602, 606, 610 further extend across the first set of endcap cells.

At 806, the first voltage (e.g., PWR, $V_{dd}$) is provided at the second set of $M_x$ layer interconnects 602, 606, 610. The first set of endcap cells includes a first set of $M_{x+1}$ layer interconnects 520 extending in a second direction orthogonal to the first direction. The first set of $M_{x+1}$ layer interconnects 520 is coupled to the first set of $M_x$ layer power interconnects 622, 618, 614 and to the second set of $M_x$ layer interconnects 602, 606, 610 to provide the first voltage source (e.g., PWR, $V_{dd}$) at the second set of $M_x$ layer interconnects.

At 808, the second voltage (e.g., GND, $V_{ss}$) is provided at the first set of $M_x$ layer interconnects 624, 620, 616. The first set of endcap cells includes a second set of $M_{x+1}$ layer interconnects 522 extending in the second direction. The second set of $M_{x+1}$ layer interconnects 522 is coupled to the second set of $M_x$ layer power interconnects 604, 608, 612 and to the first set of $M_x$ layer interconnects 624, 620, 616 to provide the second voltage source (e.g., GND, $V_{ss}$) at the first set of $M_x$ layer interconnects. The first set of $M_x$ layer power interconnects 622, 618, 614 and the first set of $M_x$ layer interconnects 624, 620, 616 function as a first set of decoupling capacitors, and the second set of $M_x$ layer power interconnects 604, 608, 612 and the second set of $M_x$ layer interconnects 602, 606, 610 function as a second set of decoupling capacitors.

In one configuration, an IC is provided. The IC includes at least a first IC portion and a second IC portion on a first side of the first IC portion. The IC includes means for providing a first voltage (e.g., PWR, $V_{dd}$) in a first set of $M_x$ layer power interconnects 622, 618, 614. The array of cells 502a is in the first IC portion. The array of cells 502a includes the first set of $M_x$ layer power interconnects 622, 618, 614 coupled to a first voltage source (e.g., PWR, $V_{dd}$) and extending adjacent to a pMOS active region 598 in a first direction across the array of cells 502a. The array of cells 502a further includes a first set of $M_x$ layer interconnects 624, 620, 616 extending adjacent to the pMOS active region 598 in the first direction across the array of cells 502a. The IC further includes means for providing a second voltage (e.g., GND, $V_{ss}$) in a second set of $M_x$ layer power interconnects 604, 608, 612. The array of cells 502a includes the second set of $M_x$ layer power interconnects 604, 608, 612 coupled to a second voltage source (e.g., GND, $V_{ss}$) less than the first voltage source (e.g., PWR, $V_{dd}$) and extending adjacent to an nMOS active region 596 in the first direction across the array of cells 502a. The array of cells 502a further includes a second set of $M_x$ layer interconnects 602, 606, 610 extending adjacent to the nMOS active region 596 in the first direction across the array of cells 502a. A first set of endcap cells is in the second IC portion. The first set of $M_x$ layer power interconnects 622, 618, 614, the first set of $M_x$ layer interconnects 624, 620, 616, the second set of $M_x$ layer power interconnects 604, 608, 612, and the second set of $M_x$ layer interconnects 602, 606, 610 further extend across the first set of endcap cells. The IC further includes means for providing the first voltage (e.g., PWR, $V_{dd}$) at the second set of $M_x$ layer interconnects 602, 606, 610. The first set of endcap cells includes a first set of $M_{x+1}$ layer interconnects 520 extending in a second direction orthogonal to the first direction. The first set of $M_{x+1}$ layer interconnects 520 is coupled to the first set of $M_x$ layer power interconnects 622, 618, 614 and to the second set of $M_x$ layer interconnects 602, 606, 610 to provide the first voltage source (e.g., PWR, $V_{dd}$) at the second set of $M_x$ layer interconnects. The IC further includes means for providing the second voltage (e.g., GND, $V_{ss}$) at the first set of $M_x$ layer interconnects 624, 620, 616. The first set of endcap cells includes a second set of $M_{x+1}$ layer interconnects 522 extending in the second direction. The second set of $M_{x+1}$ layer interconnects 522 is coupled to the second set of $M_x$ layer power interconnects 604, 608, 612 and to the first set of $M_x$ layer interconnects 624, 620, 616 to provide the second voltage source (e.g., GND, $V_{ss}$) at the first set of $M_x$ layer interconnects. The first set of $M_x$ layer power interconnects 622, 618, 614 and the first set of $M_x$ layer interconnects 624, 620, 616 function as a first set of decoupling capacitors, and the second set of $M_x$ layer power interconnects 604, 608, 612 and the second set of $M_x$ layer interconnects 602, 606, 610 function as a second set of decoupling capacitors.

Decoupling capacitors decouple one part of a circuit from another part of a circuit. Noise caused by circuit elements may be shunted through decoupling capacitors, reducing the effect that the noise has on other circuit elements. Decoupling capacitors may take up a lot of space on an IC. An exemplary (standard) cell architecture with intrinsic/built-in decoupling capacitors is provided supra. The exemplary cell architecture with intrinsic/built-in decoupling capacitors may save space on an IC, as the decoupling capacitors are intrinsic and built into standard cells that perform various logic functions, such as buffers, inverters, AND gates, NAND gates, OR gates, NOR gates, and other logic functions. As discussed supra, the exemplary decoupling capacitors may be formed intrinsically within standard cells on metal layers at or below M3, M2, or M1, and specifically on the M0 layer. The terminals of the built-in decoupling capacitors may be coupled to $V_{dd}$ and $V_{ss}$ through interconnects within endcap cells, through interconnects in CMOS break cells, and/or otherwise through interconnects that extend at breaks of the pMOS/nMOS active regions (OD breaks). Such interconnects couple $V_{dd}$ from a decoupling capacitor terminal adjacent a pMOS active region to another terminal adjacent an nMOS active region, and couple $V_{ss}$ from a decoupling capacitor terminal adjacent an nMOS active region to another terminal adjacent a pMOS active region. Accordingly, a plurality of interleaving interconnects/terminals coupled to $V_{dd}$ and $V_{ss}$ are adjacent pMOS active regions and nMOS active regions. Terminals coupled to $V_{dd}$ adjacent the pMOS active region also power pMOS transistors in the pMOS active region and terminals coupled to $V_{ss}$ adjacent the nMOS active region also power nMOS transistors in the nMOS active region. The pMOS/nMOS transistors together provide CMOS logic functions.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An integrated circuit (IC), the IC including at least a first IC portion and a second IC portion on a first side of the first IC portion, the IC comprising:
   an array of cells in the first IC portion, the array of cells including a first set of metal x ($M_x$) layer power interconnects coupled to a first voltage source and extending adjacent to a p-type metal oxide semiconductor (MOS) (pMOS) active region in a first direction across the array of cells, a first set of $M_x$ layer interconnects extending adjacent to the pMOS active region in the first direction across the array of cells, a second set of $M_x$ layer power interconnects coupled to a second voltage source less than the first voltage source and extending adjacent to an n-type MOS (nMOS) active region in the first direction across the array of cells, and a second set of $M_x$ layer interconnects extending adjacent to the nMOS active region in the first direction across the array of cells; and
   a first set of endcap cells in the second IC portion, wherein the first set of $M_x$ layer power interconnects, the first set of $M_x$ layer interconnects, the second set of $M_x$ layer power interconnects, and the second set of $M_x$ layer interconnects further extend across the first set of endcap cells, the first set of endcap cells comprising:
   a first set of metal x+1 ($M_{x+1}$) layer interconnects extending in a second direction orthogonal to the first direction, the first set of $M_{x+1}$ layer interconnects being coupled to the first set of $M_x$ layer power interconnects and to the second set of $M_x$ layer interconnects to provide the first voltage source at the second set of $M_x$ layer interconnects; and
   a second set of $M_{x+1}$ layer interconnects extending in the second direction, the second set of $M_{x+1}$ layer interconnects being coupled to the second set of $M_x$ layer power interconnects and to the first set of $M_x$ layer interconnects to provide the second voltage source at the first set of $M_x$ layer interconnects,
   wherein the first set of $M_x$ layer power interconnects and the first set of $M_x$ layer interconnects function as a first set of decoupling capacitors, and the second set of $M_x$ layer power interconnects and the second set of $M_x$ layer interconnects function as a second set of decoupling capacitors.

2. The IC of claim 1, wherein the first set of $M_x$ layer power interconnects and the first set of $M_x$ layer interconnects are interleaving in the second direction, and the second set of $M_x$ layer power interconnects and the second set of $M_x$ layer interconnects are interleaving in the second direction.

3. The IC of claim 2, wherein the first set of $M_x$ layer power interconnects comprises $S_{1p}$ $M_x$ layer power interconnects, the first set of $M_x$ layer interconnects comprises $S_1$ $M_x$ layer interconnects, the second set of $M_x$ layer power interconnects comprises $S_{2p}$ $M_x$ layer power interconnects, and the second set of $M_x$ layer interconnects comprises $S_2$ $M_x$ layer interconnects, where $|S_{1p}-S_1| \le 1$ and $|S_{2p}-S_2| \le 1$, and wherein the first set of $M_x$ layer power interconnects and the first set of $M_x$ layer interconnects form $S_{1p}+S_1-1$ decoupling capacitors, and the second set of $M_x$ layer power interconnects and the second set of $M_x$ layer interconnects form $S_{2p}+S_2-1$ decoupling capacitors.

4. The IC of claim 1, wherein the first set of $M_{x+1}$ layer interconnects and the second set of $M_{x+1}$ layer interconnects are interleaving in the first direction.

5. The IC of claim 1, wherein the IC includes a third IC portion on a second side of the first IC portion, second side being opposite the first side with respect to the first IC portion, the IC further comprising:
a second set of endcap cells in the third IC portion, wherein the first set of $M_x$ layer power interconnects, the first set of $M_x$ layer interconnects, the second set of $M_x$ layer power interconnects, and the second set of $M_x$ layer interconnects further extend across the second set of endcap cells, the second set of endcap cells comprising:
a third set of $M_{x+1}$ layer interconnects extending in the second direction, the third set of $M_{x+1}$ layer interconnects being coupled to the first set of $M_x$ layer power interconnects and to the second set of $M_x$ layer interconnects to provide the first voltage source at the second set of $M_x$ layer interconnects; and
a fourth set of $M_{x+1}$ layer interconnects extending in the second direction, the fourth set of $M_{x+1}$ layer interconnects being coupled to the second set of $M_x$ layer power interconnects and to the first set of $M_x$ layer interconnects to provide the second voltage source at the first set of $M_x$ layer interconnects.

6. The IC of claim 1, wherein the third set of $M_{x+1}$ layer interconnects and the fourth set of $M_{x+1}$ layer interconnects are interleaving in the first direction.

7. The IC of claim 1, wherein the IC further includes:
a third set of $M_{x+1}$ layer interconnects extending in the second direction and coupling the first set of $M_x$ layer power interconnects together; and
a fourth set of $M_{x+1}$ layer interconnects extending in the second direction and coupling the second set of $M_x$ layer power interconnects together.

8. The IC of claim 1, wherein:
the first set of $M_x$ layer power interconnects includes a first first-set $M_x$ layer power interconnect, the first set of $M_x$ layer interconnects includes a first first-set $M_x$ layer interconnect adjacent the first first-set $M_x$ layer power interconnect, the second set of $M_x$ layer power interconnects includes a first second-set $M_x$ layer power interconnect, and the second set of $M_x$ layer interconnects includes a first second-set $M_x$ layer interconnect adjacent the first second-set $M_x$ layer power interconnect;

the first set of $M_{x+1}$ layer interconnects is coupled to the first first-set $M_x$ layer power interconnect and to the first second-set $M_x$ layer interconnect to provide the first voltage source at the first second-set $M_x$ layer interconnect;
the second set of $M_{x+1}$ layer interconnects is coupled to the first second-set $M_x$ layer power interconnect and to the first first-set $M_x$ layer interconnect to provide the second voltage source at the first first-set $M_x$ layer interconnect; and
the first first-set $M_x$ layer power interconnect and the first first-set $M_x$ layer interconnect function as a first decoupling capacitor of the first set of decoupling capacitors, and the first second-set $M_x$ layer power interconnect and the first second-set $M_x$ layer interconnect function as a second decoupling capacitor of the second set of decoupling capacitors.

9. The IC of claim 1, wherein the IC further comprises a set of complementary MOS (CMOS) break cells that are predominantly void of a pMOS active region and an nMOS active region, wherein the set of CMOS break cells comprises a third set of $M_{x+1}$ layer interconnects, each $M_{x+1}$ layer interconnect in the third set of $M_{x+1}$ layer interconnects coupling one of the first set of $M_x$ layer power interconnects to the second set of $M_x$ layer interconnects to provide the first voltage source at the second set of $M_x$ layer interconnects, or the second set of $M_x$ layer power interconnects to the first set of $M_x$ layer interconnects to provide the second voltage source at the first set of $M_x$ layer interconnects.

10. The IC of claim 1, wherein x is $\le 3$.

11. The IC of claim 10, wherein x is $\le 2$.

12. The IC of claim 11, wherein x is 0.

13. A method of operation of an integrated circuit (IC), the IC including at least a first IC portion and a second IC portion on a first side of the first IC portion, the method comprising:
providing a first voltage in a first set of metal x ($M_x$) layer power interconnects, an array of cells being in the first IC portion, the array of cells including the first set of $M_x$ layer power interconnects coupled to a first voltage source and extending adjacent to a p-type metal oxide semiconductor (MOS) (pMOS) active region in a first direction across the array of cells, the array of cells further including a first set of $M_x$ layer interconnects extending adjacent to the pMOS active region in the first direction across the array of cells;
providing a second voltage in a second set of $M_x$ layer power interconnects, the array of cells including the second set of $M_x$ layer power interconnects coupled to a second voltage source less than the first voltage source and extending adjacent to an n-type MOS (nMOS) active region in the first direction across the array of cells, the array of cells further including a second set of $M_x$ layer interconnects extending adjacent to the nMOS active region in the first direction across the array of cells, a first set of endcap cells being in the second IC portion, wherein the first set of $M_x$ layer power interconnects, the first set of $M_x$ layer interconnects, the second set of $M_x$ layer power interconnects, and the second set of $M_x$ layer interconnects further extend across the first set of endcap cells;
providing the first voltage at the second set of $M_x$ layer interconnects, the first set of endcap cells including a first set of metal x+1 ($M_{x+1}$) layer interconnects extending in a second direction orthogonal to the first direction, the first set of $M_{x+1}$ layer interconnects being coupled to the first set of $M_x$ layer power interconnects and to the second set of $M_x$ layer interconnects to provide the first voltage source at the second set of $M_x$ layer interconnects; and providing the second voltage at the first set of $M_x$ layer interconnects, the first set of endcap cells including a second set of $M_{x+1}$ layer interconnects extending in the second direction, the second set of $M_{x+1}$ layer interconnects being coupled to the second set of $M_x$ layer power interconnects and to the first set of $M_x$ layer interconnects to provide the second voltage source at the first set of $M_x$ layer interconnects, wherein the first set of $M_x$ layer power interconnects and the first set of $M_x$ layer interconnects function as a first set of decoupling capacitors, and the second set of $M_x$ layer power interconnects and the second set of $M_x$ layer interconnects function as a second set of decoupling capacitors.

14. The method of claim 13, wherein the first set of $M_x$ layer power interconnects and the first set of $M_x$ layer interconnects are interleaving in the second direction, and the second set of $M_x$ layer power interconnects and the second set of $M_x$ layer interconnects are interleaving in the second direction.

15. The method of claim 14, wherein the first set of $M_x$ layer power interconnects comprises $S_{1p}$ $M_x$ layer power interconnects, the first set of $M_x$ layer interconnects comprises $S_1$ $M_x$ layer interconnects, the second set of $M_x$ layer power interconnects comprises $S_{2p}$ $M_x$ layer power interconnects, and the second set of $M_x$ layer interconnects comprises $S_2$ $M_x$ layer interconnects, where $|S_{1p}-S_1|\leq 1$ and $|S_{2p}-S_2|\leq 1$, and wherein the first set of $M_x$ layer power interconnects and the first set of $M_x$ layer interconnects form $S_{1p}+S_1-1$ decoupling capacitors, and the second set of $M_x$ layer power interconnects and the second set of $M_x$ layer interconnects form $S_{2p}+S_2-1$ decoupling capacitors.

16. The method of claim 13, wherein the first set of $M_{x+1}$ layer interconnects and the second set of $M_{x+1}$ layer interconnects are interleaving in the first direction.

17. The method of claim 13, wherein the IC includes a third IC portion on a second side of the first IC portion, second side being opposite the first side with respect to the first IC portion, the IC further comprising:

a second set of endcap cells in the third IC portion, wherein the first set of $M_x$ layer power interconnects, the first set of $M_x$ layer interconnects, the second set of $M_x$ layer power interconnects, and the second set of $M_x$ layer interconnects further extend across the second set of endcap cells, the second set of endcap cells comprising:

a third set of $M_{x+1}$ layer interconnects extending in the second direction, the third set of $M_{x+1}$ layer interconnects being coupled to the first set of $M_x$ layer power interconnects and to the second set of $M_x$ layer interconnects to provide the first voltage source at the second set of $M_x$ layer interconnects; and a fourth set of $M_{x+1}$ layer interconnects extending in the second direction, the fourth set of $M_{x+1}$ layer interconnects being coupled to the second set of $M_x$ layer power interconnects and to the first set of $M_x$ layer interconnects to provide the second voltage source at the first set of $M_x$ layer interconnects.

18. The method of claim 13, wherein the third set of $M_{x+1}$ layer interconnects and the fourth set of $M_{x+1}$ layer interconnects are interleaving in the first direction.

19. The method of claim 13, wherein the IC further includes:

a third set of $M_{x+1}$ layer interconnects extending in the second direction and coupling the first set of $M_x$ layer power interconnects together; and a fourth set of $M_{x+1}$ layer interconnects extending in the second direction and coupling the second set of $M_x$ layer power interconnects together.

20. The method of claim 13, wherein:

the first set of $M_x$ layer power interconnects includes a first first-set $M_x$ layer power interconnect, the first set of $M_x$ layer interconnects includes a first first-set $M_x$ layer interconnect adjacent the first first-set $M_x$ layer power interconnect, the second set of $M_x$ layer power interconnects includes a first second-set $M_x$ layer power interconnect, and the second set of $M_x$ layer interconnects includes a first second-set $M_x$ layer interconnect adjacent the first second-set $M_x$ layer power interconnect;

the first set of $M_{x+1}$ layer interconnects is coupled to the first first-set $M_x$ layer power interconnect and to the first second-set $M_x$ layer interconnect to provide the first voltage source at the first second-set $M_x$ layer interconnect;

the second set of $M_{x+1}$ layer interconnects is coupled to the first second-set $M_x$ layer power interconnect and to the first first-set $M_x$ layer interconnect to provide the second voltage source at the first first-set $M_x$ layer interconnect; and the first first-set $M_x$ layer power interconnect and the first first-set $M_x$ layer interconnect function as a first decoupling capacitor of the first set of decoupling capacitors, and the first second-set $M_x$ layer power interconnect and the first second-set $M_x$ layer interconnect function as a second decoupling capacitor of the second set of decoupling capacitors.

21. The method of claim 13, wherein x is $\leq 3$.

22. An integrated circuit (IC), the IC including at least a first IC portion and a second IC portion on a first side of the first IC portion, the IC comprising:

means for providing a first voltage in a first set of metal x ($M_x$) layer power interconnects, an array of cells being in the first IC portion, the array of cells including the first set of $M_x$ layer power interconnects coupled to a first voltage source and extending adjacent to a p-type metal oxide semiconductor (MOS) (pMOS) active region in a first direction across the array of cells, the array of cells further including a first set of $M_x$ layer interconnects extending adjacent to the pMOS active region in the first direction across the array of cells;

means for providing a second voltage in a second set of $M_x$ layer power interconnects, the array of cells including the second set of $M_x$ layer power interconnects coupled to a second voltage source less than the first voltage source and extending adjacent to an n-type MOS (nMOS) active region in the first direction across the array of cells, the array of cells further including a second set of $M_x$ layer interconnects extending adjacent to the nMOS active region in the first direction across the array of cells, a first set of endcap cells being in the second IC portion, wherein the first set of $M_x$ layer power interconnects, the first set of $M_x$ layer interconnects, the second set of $M_x$ layer power interconnects, and the second set of $M_x$ layer interconnects further extend across the first set of endcap cells;

means for providing the first voltage at the second set of $M_x$ layer interconnects, the first set of endcap cells including a first set of metal x+1 ($M_{x+1}$) layer interconnects extending in a second direction orthogonal to the first direction, the first set of $M_{x+1}$ layer interconnects being coupled to the first set of $M_x$ layer power interconnects and to the second set of $M_x$ layer interconnects to provide the first voltage source at the second set of $M_x$ layer interconnects; and means for providing the second voltage at the first set of $M_x$ layer interconnects, the first set of endcap cells including a second set of $M_{x+1}$ layer interconnects extending in the second direction, the second set of $M_{x+1}$ layer interconnects being coupled to the second set of $M_x$ layer power interconnects and to the first set of $M_x$ layer interconnects to provide the second voltage source at the first set of $M_x$ layer interconnects, wherein the first set of $M_x$ layer power interconnects and the first set of $M_x$ layer interconnects function as a first set of decoupling capacitors, and the second set of $M_x$ layer power interconnects and the second set of $M_x$ layer interconnects function as a second set of decoupling capacitors.

23. The IC of claim 22, wherein the first set of $M_x$ layer power interconnects and the first set of $M_x$ layer interconnects are interleaving in the second direction, and the second set of $M_x$ layer power interconnects and the second set of $M_x$ layer interconnects are interleaving in the second direction.

24. The IC of claim 23, wherein the first set of $M_x$ layer power interconnects comprises $S_{1p}$ $M_x$ layer power interconnects, the first set of $M_x$ layer interconnects comprises $S_1$ $M_x$ layer interconnects, the second set of $M_x$ layer power interconnects comprises $S_{2p}$ $M_x$ layer power interconnects, and the second set of $M_x$ layer interconnects comprises $S_2$ $M_x$ layer interconnects, where $|S_{1p}-S_1| \le 1$ and $|S_{2p}-S_2| \le 1$, and wherein the first set of $M_x$ layer power interconnects and the first set of $M_x$ layer interconnects form $S_{1p}+S_1-1$ decoupling capacitors, and the second set of $M_x$ layer power interconnects and the second set of $M_x$ layer interconnects form $S_{2p}+S_2-1$ decoupling capacitors.

25. The IC of claim 22, wherein the first set of $M_{x+1}$ layer interconnects and the second set of $M_{x+1}$ layer interconnects are interleaving in the first direction.

26. The IC of claim 22, wherein the IC includes a third IC portion on a second side of the first IC portion, second side being opposite the first side with respect to the first IC portion, the IC further comprising:

a second set of endcap cells in the third IC portion, wherein the first set of $M_x$ layer power interconnects, the first set of $M_x$ layer interconnects, the second set of $M_x$ layer power interconnects, and the second set of $M_x$ layer interconnects further extend across the second set of endcap cells, the second set of endcap cells comprising:

a third set of $M_{x+1}$ layer interconnects extending in the second direction, the third set of $M_{x+1}$ layer interconnects being coupled to the first set of $M_x$ layer power interconnects and to the second set of $M_x$ layer interconnects to provide the first voltage source at the second set of $M_x$ layer interconnects; and a fourth set of $M_{x+1}$ layer interconnects extending in the second direction, the fourth set of $M_{x+1}$ layer interconnects being coupled to the second set of $M_x$ layer power interconnects and to the first set of $M_x$ layer interconnects to provide the second voltage source at the first set of $M_x$ layer interconnects.

27. The IC of claim 22, wherein the third set of $M_{x+1}$ layer interconnects and the fourth set of $M_{x+1}$ layer interconnects are interleaving in the first direction.

28. The IC of claim 22, wherein the IC further includes:

a third set of $M_{x+1}$ layer interconnects extending in the second direction and coupling the first set of $M_x$ layer power interconnects together; and a fourth set of $M_{x+1}$ layer interconnects extending in the second direction and coupling the second set of $M_x$ layer power interconnects together.

29. The IC of claim 22, wherein:

the first set of $M_x$ layer power interconnects includes a first first-set $M_x$ layer power interconnect, the first set of $M_x$ layer interconnects includes a first first-set $M_x$ layer interconnect adjacent the first first-set $M_x$ layer power interconnect, the second set of $M_x$ layer power interconnects includes a first second-set $M_x$ layer power interconnect, and the second set of $M_x$ layer interconnects includes a first second-set $M_x$ layer interconnect adjacent the first second-set $M_x$ layer power interconnect;

the first set of $M_{x+1}$ layer interconnects is coupled to the first first-set $M_x$ layer power interconnect and to the first second-set $M_x$ layer interconnect to provide the first voltage source at the first second-set $M_x$ layer interconnect;

the second set of $M_{x+1}$ layer interconnects is coupled to the first second-set $M_x$ layer power interconnect and to the first first-set $M_x$ layer interconnect to provide the second voltage source at the first first-set $M_x$ layer interconnect; and the first first-set $M_x$ layer power interconnect and the first first-set $M_x$ layer interconnect function as a first decoupling capacitor of the first set of decoupling capacitors, and the first second-set $M_x$ layer power interconnect and the first second-set $M_x$ layer interconnect function as a second decoupling capacitor of the second set of decoupling capacitors.

30. The IC of claim 22, wherein x is $\le 3$.

* * * * *